United States Patent
Yu et al.

(10) Patent No.: US 7,286,353 B2
(45) Date of Patent: Oct. 23, 2007

(54) HEAT DISSIPATING APPARATUS

(75) Inventors: Fang-Xiang Yu, ShenZhen (CN);
Meng-Tsu Lee, Tu-Cheng (TW);
Shu-Ho Lin, Tu-Cheng (TW); Jun Luo, ShenZhen (CN)

(73) Assignees: Fu Zhun Precision Industry (Shenzhen) Co., Ltd., Bao'an District, Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 87 days.

(21) Appl. No.: 11/242,393

(22) Filed: Oct. 3, 2005

(65) Prior Publication Data

US 2006/0120044 A1  Jun. 8, 2006

(30) Foreign Application Priority Data

Dec. 4, 2004  (CN)  .................. 2004 2 0102409

(51) Int. Cl.
*H05K 7/20*  (2006.01)

(52) U.S. Cl. ............ 361/697; 361/695; 361/700; 361/704; 361/719; 165/80.3; 165/104.33

(58) Field of Classification Search ........ 361/694–723; 165/80.3–80.5, 104.33, 185
See application file for complete search history.

(56) References Cited

U.S. PATENT DOCUMENTS

| | | | |
|---|---|---|---|
| 5,504,650 A * | 4/1996 | Katsui et al. ............... 361/697 |
| 5,559,674 A * | 9/1996 | Katsui ......................... 361/697 |
| 5,561,325 A * | 10/1996 | Ueno et al. .................. 257/718 |
| 5,583,316 A * | 12/1996 | Kitahara et al. ........... 174/16.3 |
| 5,629,560 A * | 5/1997 | Katsui et al. ............... 257/712 |
| 5,650,912 A * | 7/1997 | Katsui et al. ............... 361/697 |
| 5,756,931 A * | 5/1998 | Kitahara et al. ........... 174/16.3 |
| 5,760,333 A * | 6/1998 | Kitahara et al. ........... 174/16.3 |
| 5,940,267 A * | 8/1999 | Katsui et al. ............... 361/697 |
| 5,953,208 A * | 9/1999 | Katsui ......................... 361/697 |
| 5,979,541 A * | 11/1999 | Saito ........................... 165/80.3 |
| 6,011,216 A * | 1/2000 | Kitahara et al. ........... 174/16.3 |
| 6,067,227 A * | 5/2000 | Katsui et al. ............... 361/695 |
| 6,140,571 A * | 10/2000 | Kitahara et al. ........... 174/16.3 |
| 6,143,977 A * | 11/2000 | Kitahara et al. ........... 174/16.3 |
| 6,166,904 A * | 12/2000 | Kitahara et al. ........... 361/397 |
| 6,222,731 B1 * | 4/2001 | Katsui ......................... 361/697 |
| 6,415,853 B1 * | 7/2002 | Tao et al. .................... 165/80.3 |
| 6,419,007 B1 * | 7/2002 | Ogawara et al. ........... 165/80.3 |
| 6,487,079 B2 * | 11/2002 | Katsui ......................... 361/704 |
| 6,538,888 B1 * | 3/2003 | Wei et al. ................... 361/697 |
| 6,827,136 B2 * | 12/2004 | Liu .......................... 165/104.33 |
| 7,013,960 B2 * | 3/2006 | Lee et al. ................ 165/104.33 |

(Continued)

*Primary Examiner*—Jayprakash Gandhi
*Assistant Examiner*—Robert J. Hoffberg
(74) *Attorney, Agent, or Firm*—Morris Manning Martin LLP; Tim Tingkang Xia, Esq.

(57) ABSTRACT

A heat dissipating apparatus includes a heat sink (20) having a base plate (22) for contacting an electronic component (10). A number of main fins (24) extend from the base plate. A cooling fan (30) is mounted on the heat sink. A center of the cooling fan offsets in a first direction from a center of the electronic component, so that a portion of the cooling fan that generates more and stronger airflows than the center of the cooling fan does is aligned with the center of the electronic component.

16 Claims, 1 Drawing Sheet

U.S. PATENT DOCUMENTS

2003/0141041 A1* 7/2003 Chen ..................... 165/80.3
2003/0230398 A1 12/2003 Lee et al.
2006/0181848 A1* 8/2006 Kiley et al. ................ 361/697
2006/0238982 A1* 10/2006 Lee et al. .................. 361/700

* cited by examiner

HEAT DISSIPATING APPARATUS

BACKGROUND OF THE INVENTION

1. Field of the Invention

The present invention relates generally to an apparatus for dissipating heat, and more particularly to a heat dissipating apparatus having a heat sink and a fan for providing forced airflows directed to the heat sink to dissipate heat generated by an electronic component.

2. Description of Related Arts

As ICs (Integrated Circuits) such as computer CPUs (Central Processing Units) are being designed to run faster and faster, more and more heat are being generated by these ICs. Heat dissipating apparatus are typically used to dissipate the heat generated by these ICs.

FIG. 2 illustrates a conventional heat dissipating apparatus for cooling an electronic component 2. The heat dissipating apparatus generally includes a heat sink 4 rested on the electronic component 2, a retaining bracket 5 and a cooling fan 6 positioned to the heat sink 4 by the retaining bracket 5. The heat sink 4 includes a base plate 42 and cooling fins 44 extending from the base plate 42. A heat pipe 46 extends in the heat sink 4.

In operation, the heat generated by the electronic component 2 is firstly transferred to the base plate 42 and then to the cooling fins 44 both by heat conduct of metal and by phase change of the heat pipe 46. The heat is radiated to ambient, with the help of the cooling fan generating airflows toward the cooling fins 44. For an electronic component, its center portion typically generates much more heat than other portions does. Therefore, a center portion of the heat dissipating apparatus accumulates more heat than other portion does. For a cooling fan, unfortunately, its center portion generates little and weak airflow during operation. Therefore, in the above-described configuration of the heat dissipating apparatus, the cooling fan 6 is generally unable to draw adequate air through the center portion of the heat dissipating apparatus to dissipate the significant amount of heat accumulated thereon. This may cause a failure of heat dissipating of the electronic component 2. Therefore, a heretofore-unaddressed need exists in the industry to address the aforementioned deficiencies and inadequacies.

SUMMARY OF THE INVENTION

The present invention provides a heat dissipating apparatus for dissipating heat of an electronic component. According to one embodiment, the heat dissipating apparatus includes a heat sink having a base plate for contacting the electronic component. A number of main fins extend from the base plate. A cooling fan is mounted on the heat sink. A center of the cooling fan offsets in a first direction from a center of the electronic component, so that a portion of the cooling fan that generates more and stronger airflows than the center of the cooling fan does is aligned with the center of the electronic component.

Other systems, methods, features and advantages of the present invention will be drawn from the following detailed description of the preferred embodiments of the present invention with attached drawings, in which:

DESCRIPTION OF PREFERRED EMBODIMENT

Figure 1:
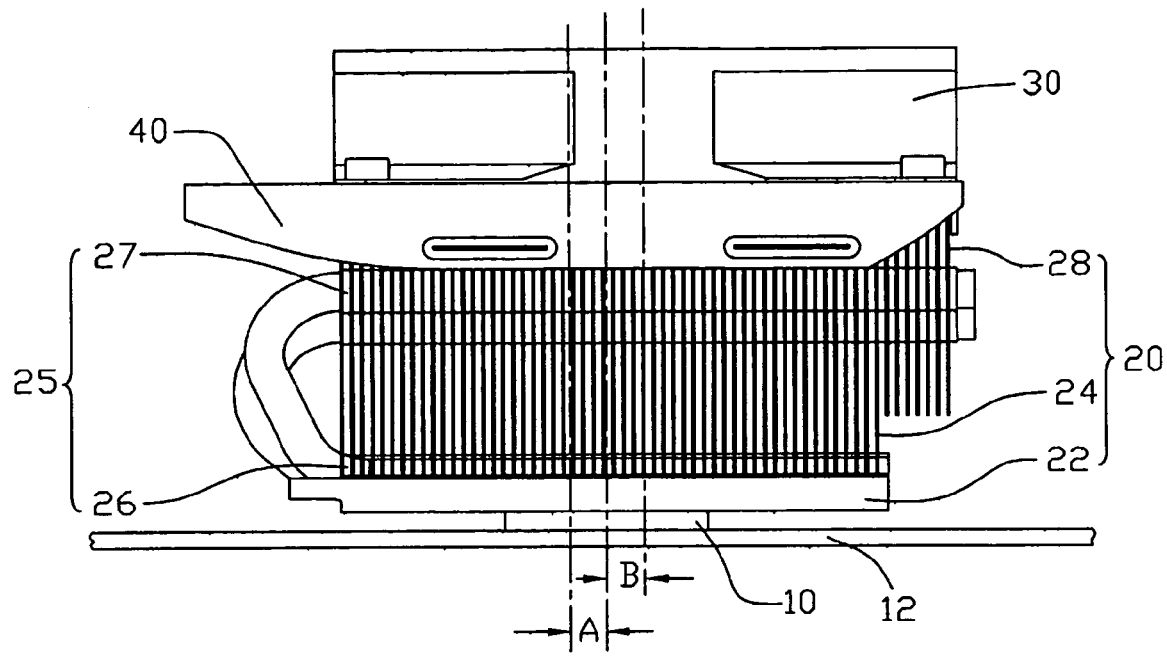
FIG. 1 is a side view of a heat dissipating apparatus in accordance with a preferred embodiment of the present invention.
Figure 2:
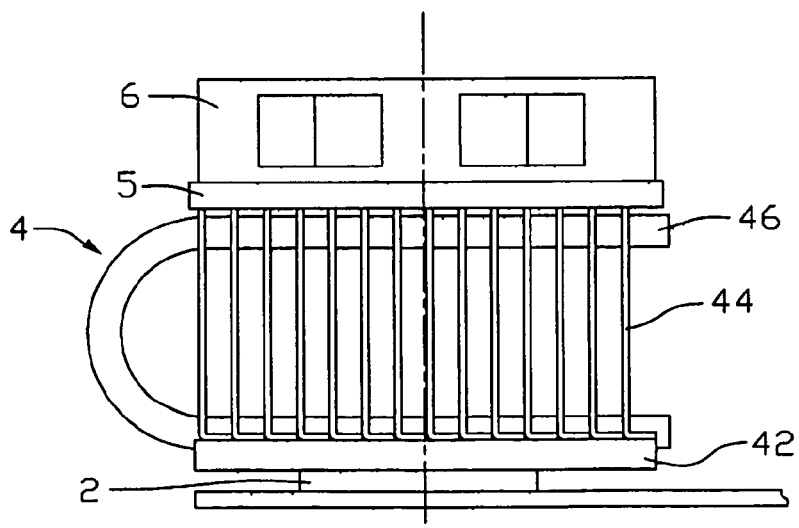
FIG. 2 is a side view of a conventional heat dissipating apparatus.

FIG. 1 illustrates by way of example a heat dissipating apparatus in accordance with a preferred embodiment of the present invention, together with an electronic component 10 mounted on a printed circuit board 12. The heat dissipating apparatus comprises a heat sink 20 attached on the electronic component 10, two heat pipes 25 extending in the heat sink 20, and a cooling fan 30 mounted on the heat sink 20.

The heat sink 20 comprises a base plate 22, a plurality of parallel main fins 24 and a plurality of parallel additional fins 28. The base plate 22 comprises a first surface contacting the electronic component 10 to absorb heat therefrom. The main fins 24 extend upwardly from an opposite second surface of the base plate 22. In the preferred embodiment, the additional fins 28 are separated from the base plate 22.

Each heat pipe 25 has a U-shaped structure, one end of which serves as an evaporating section 26, and the other which serves as a condensing section 27. The condensing section 27 is longer than the evaporating section 27. The evaporating section 26 is joined with the base plate 22 of the heat sink 20 for absorbing heat from the base plate 22. The condensing section 27 extends through the main fins 24. A free end portion of the condensing section 27 extends beyond the main fins 24. The additional fins 28 are attached around the free end portion of the condensing section 27 that extends beyond the main fins 24. The additional fins 28 are parallel to the main fins 24. Two heat pipes 25 are included in the heat dissipating apparatus of this embodiment. In alternative embodiments, heat pipes of other number may be used.

The cooling fan 30 is positioned on the heat sink 20 by a retaining bracket 40. The retaining bracket 40 is mounted on the main fins 24 and the additional fins 28. A width of the retaining bracket 40 along extension direction of the condensing section 27 of the heat pipe 25 is greater than that of the combination of the main fins 24 and the additional fins 28. As shown in FIG. 1, the retaining bracket 40 extends beyond the main fins 24 at a left side of the heat dissipating apparatus, and the retaining bracket 40 is aligned with the additional fins 28 at a right side of the heat dissipating apparatus. As a result, a center of the retaining bracket 40 offsets leftward from a center of the electronic component 10 with a distance A. The cooling fan 30 has such a width that it is aligned with the main fins 24 at the left side and the additional fins 28 at the right side of the heat dissipating apparatus. Therefore, airflows generated by the cooling fan 30 can be directed to the main fins 24 and the additional fins 28. As a result, a center of the cooling fan 30 offsets rightward from the center of the electronic component 10 with a distance B. The distances A and B are so selected that the gravity center of the whole heat dissipating apparatus is aligned with the center of the electronic component 10. This can ensure the heat dissipating apparatus to steadily rest on the electronic component 10.

Since the center of the cooling fan 30 offsets from the center of the electronic component 10, the portion of the cooling fan 30 that can generate more and stronger airflows is aligned with the center of the electronic component 10. Therefore, more air generated by the cooling fan 30 will be directed to a center portion of the base plate 22 and a part of the main fins 24 on the center portion of the base plate 22. Because the center portion of the base plate 22 and the part of the main fins 24 thereon accumulate more heat than other portions of the heat dissipating apparatus, this offset design of the heat dissipating apparatus can achieve an improved cooling efficiency. In addition, the additional fins 28 can dissipate additional heat from the condensing section. This further improves the cooling efficiency of the heat dissipating efficiency.

It is understood that the invention may be embodied in other forms without departing from the spirit thereof. The above-described examples and embodiments are to be considered in all respects as illustrative and not restrictive, and the invention is not to be limited to the details given above.

We claim:

1. A heat dissipating apparatus comprising:
   a heat sink comprising a base plate for contacting an electronic component, and a plurality of main fins extending from the base plate;
   a cooling fan mounted on the heat sink, wherein a center of the cooling fan offsets in a first direction from a center of the electronic component, so that a portion of the cooling fan, that generates more and stronger airflows than the center of the cooling fan does, is aligned with the center of the electronic component;
   a heat pipe comprising an evaporating section joined with the base plate, and a condensing section extending in the main fins, the condensing section of the heat pipe comprising a free end portion extending in said first direction beyond the main fins; and
   a plurality of additional fins attached around the free end portion of the condensing section of the heat pipe.

2. The heat dissipating apparatus of claim 1, further comprising a retaining bracket to retain the cooling fan to the heat sink, wherein a center of the retaining bracket offsets from the center of the electronic component in a second direction that is opposite to the first direction, so that a gravity center of the heat dissipating apparatus is aligned with the center of the electronic component in a direction perpendicular to said first and second directions.

3. The heat dissipating apparatus of claim 2, wherein the retaining bracket has a side extending in said second direction beyond a corresponding side of the main fins.

4. The heat dissipating apparatus of claim 2, wherein the retaining bracket has a side extending in said second direction beyond a corresponding side of the cooling fan.

5. The heat dissipating apparatus of claim 2, wherein the retaining bracket has a width which is greater than that of the cooling fan.

6. The heat dissipating apparatus of claim 1, wherein the heat pipe has a U-shaped configuration.

7. The heat dissipating apparatus of claim 6, wherein the condensing section is longer than the evaporating section.

8. The heat dissipating apparatus of claim 6, further comprising a retaining bracket to retain the cooling fan to the heat sink, the retaining bracket having a width which is greater than that of a combination of the main fins and the additional fins along extension direction of the condensing section of the heat pipe.

9. A heat dissipating apparatus comprising:
   a base plate for contacting a heat source;
   a plurality of main fins extending from the base plate;
   at least one heat pipe having an evaporating section for absorbing heat from the base plate, and a condensing section for transferring the heat to the main fins, a free end portion of the condensing section extending beyond the main fins;
   a plurality of additional fins attached around the free end portion; and
   a cooling fan provided for generating airflows toward the main fins and the additional fins, wherein along extension direction of the condensing section, the cooling fan is aligned with the main fins at a first side of the heat dissipating apparatus, and the cooling fan is aligned with the additional fins at an opposite second side of the heat dissipating apparatus.

10. The heat dissipating apparatus of claim 9, wherein the condensing section is longer than the evaporating section.

11. The heat dissipating apparatus of claim 9, wherein the at least one heat pipe has a U-shaped configuration.

12. The heat dissipating apparatus of claim 9, wherein the additional fins are separated from the base plate.

13. The heat dissipating apparatus of claim 9, wherein the cooling fan is positioned to the cooling fins and the additional fins by a retaining bracket, a center of the cooling fan offsets in a first direction from a center of the electronic component, so that a portion of the cooling fan that generates more and stronger airflows than the center of the cooling fan does is aligned with the center of the electronic component, and a center of the retaining bracket offsets from the center of the electronic component in a second direction that is opposite to the first direction, so that a gravity center of the heat dissipating apparatus is aligned with the center of the electronic component in a direction perpendicular to said first and second directions.

14. The heat dissipating apparatus of claim 13, wherein the retaining bracket extends beyond the main fins at the first side of the heat dissipating apparatus, and the retaining bracket is aligned with the additional fins at the second side of the heat dissipating apparatus.

15. An electronic assembly comprising:
   a heat-generating electronic component having a center; and
   a heat dissipating apparatus, comprising:
   a base plate mounted on the heat-generating electronic component;
   a first group of fins extending upwardly from the base plate;
   a heat pipe and a second group of fins, the heat pipe having an evaporating section thermally engaging with the base plate and a condensing section thermally engaging with the first group of fins and the second group of fins;
   a retaining bracket mounted on the first group of fins; and
   a cooling fan mounted on the retaining bracket, said cooling fan having a center offset from the center of the heat-generating electronic component in a first direction;
   wherein the retaining bracket has a center which is offset from the center of the heat-generating electronic component in a second direction opposite the first direction; and
   wherein the cooling fan has a width which is equal to a combination of widths of the first and second groups of fins.

16. The electronic assembly of claim 15, wherein the retaining bracket has a width which is greater than a combination of widths of the first and second groups of fins.

* * * * *